(12) United States Patent
Kodama

(10) Patent No.: US 6,713,818 B2
(45) Date of Patent: Mar. 30, 2004

(54) ELECTROSTATIC DISCHARGE PROTECTION DEVICE

(75) Inventor: Noriyuki Kodama, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/443,578

(22) Filed: May 22, 2003

(65) Prior Publication Data

US 2003/0218841 A1 Nov. 27, 2003

(30) Foreign Application Priority Data

May 24, 2002 (JP) ........................... 2002-151142
Apr. 25, 2003 (JP) ........................... 2003-122535

(51) Int. Cl.$^7$ ............................... H01L 23/62

(52) U.S. Cl. ................ 257/362; 257/355; 257/360

(58) Field of Search ..................... 257/362, 355, 257/356, 357, 360

(56) References Cited

U.S. PATENT DOCUMENTS

| | | | |
|---|---|---|---|
| 5,502,317 A | | 3/1996 | Duvvury |
| 5,637,900 A | * | 6/1997 | Ker et al. ............... 257/355 |
| 5,747,834 A | | 5/1998 | Chen et al. |
| 6,246,079 B1 | * | 6/2001 | Chen ........................ 257/173 |
| 6,580,184 B2 | * | 6/2003 | Song ........................ 307/112 |
| 2002/0053704 A1 | | 5/2002 | Avery et al. |
| 2002/0153571 A1 | | 10/2002 | Mergens et al. |

FOREIGN PATENT DOCUMENTS

JP    9-107074    4/1997

OTHER PUBLICATIONS

Mergens, et al., "High Holding Current SCRS (HHI–SCR) for ESD Protection and Latch–Up Immune IC Operations" 24$^{th}$ Annual EOS/ESD Symposium, Oct. 6–10, 2002, pp. 1–8.

Russ, et al., "GGSCRS: GGNMOS Triggered Silicon Controlled Rectifiers for ESD Protection in Deep Sub–Micron CMOS Processes" EOS/ESD Symposium, Sep. 9–13, 2001, pp. 1A.3.1–1.A.3–10.

Wu, et al., "Breakdown and Latent Damage of Ultra–Thin Gate Oxides Under ESD Stress Conditions" Electrical Overstress/Electrostatic Discharge Symposium Proceedings, Sep. 26–28, 2000, pp. 1–9.

Chatterjee, et al. A Low–Voltage Triggering SCR for On–Chip ESD Protection at Output and Input Pads. IEEE Electron Device Letters, vol. 12 No. 1 Jan. 1991. pp. 1–2.

Amerasekera et al. Substrate Triggering and Salicide Effects on ESD Performance and Protection Circuit Design in Deep Submicron CMOS Processes. IEEE 1995 pp. 1–4.

* cited by examiner

Primary Examiner—Phat X. Cao
Assistant Examiner—Theresa T. Doan
(74) Attorney, Agent, or Firm—Katten Muchin Zavis Rosenman

(57) ABSTRACT

An N well is formed in a surface of a P$^+$ substrate and a P well is formed in such a way as to surround the N well. Then, a trigger tap (P$^+$ diffusion region) is formed in the surface of the P well and two cathodes (N$^+$ diffusion regions) are formed in such a way as to hold the trigger tap. Then, an anode (P$^+$ diffusion region) is formed in the surface of the N well in a position facing the trigger tap and the cathode, and an N well pick-up diffusion (N$^+$ diffusion region) is formed in such a way as to surround that side edge of the anode which does not face the cathode. Accordingly, the resistance between the end portion of the anode and the N well pick-up diffusion (N$^+$ diffusion region) becomes lower than the resistance between the center portion of the anode and the N well pick-up diffusion.

16 Claims, 13 Drawing Sheets

3  4  29  28    7   6

ELECTROSTATIC DISCHARGE PROTECTION DEVICE

BACKGROUND OF THE INVENTION

1. Field of the Invention

The present invention relates to an on-chip electrostatic discharge protection device, which is provided on a chip and protects an internal circuit against electrostatic discharge.

2. Description of the Related Art

The recent complex and high density design of semiconductor devices is bringing about such a problem that semiconductor devices are damaged by electrostatic discharge (ESD) during an assembling process or the like in the fabrication process. As one measure against the problem, an on-chip electrostatic discharge protection device (hereinafter also called "ESD protection device"), which protects elements in an internal circuit by efficiently discharging an electrostatic discharge current in a safe path, is provided in the chip of a semiconductor device.

Conventionally, a protection device comprised of a protection resistor and a diode has been used as an ESD protection device for a circuit device, such as CMOSLSI. However, the use of ESD protection devices that utilize the snap-back phenomenon of an MOSFET (Metal Oxide Semiconductor Field Effect Transistor), which has a lower resistance and a better voltage clamping performance, is gradually becoming popular.

In an ESD protection device comprised of an MOSFET, as a large current is input to the drain of the MOSFET, the PN junction on the drain side causes avalanche breakdown, so that the current flows toward the substrate and is absorbed by, for example, the ground contact, such as a latch-up preventing $P^+$ guard ring. A potential difference occurs along the current path in accordance with the product of the resistance of the path and the current value, thereby increasing the local potential of the substrate. As a result, the potential of the PN junction on the source side increases to cause conduction, thereby further increasing the current that flows toward the substrate. Positive feedback occurs on the current that flows toward the substrate, so that the PN junction on the source side is forward-biased spontaneously, i.e., within a time of less than one nano second and comes to the operational state of a parasitic bipolar. This forms a low-resistance current path.

In such a case of using an MOSFET as an ESD protection device, the entire width of the MOSFET should be set to the order of about several hundred micrometers to ensure a sufficiently low resistance of several ohms in order to demonstrate the adequate protecting performance. Normally, small transistors whose widths are of about 10 to 100 μm (which are called "fingers") are laid out in parallel are used.

Such a MOSFET type ESD protection device however has the following problems. Because the current is apt to concentrate on the drain-side end portion of the MOSFET type ESD protection device, the drain-side end portion of the gate electrode generates heat, so that the MOSFET type ESD protection device is likely to break down. Further, as the timings at which the individual fingers snap back to have a low resistance differ from one another, the current concentrates on the that finger which has snapped back faster so that the finger is likely to break down. Those shortcomings lower the protecting performance of the MOSFET type ESD protection device. Therefore, it is important for the MOS- FET type ESD protection device to take some measures to prevent the excess current from flowing to the end portion of the gate electrode and to allow the current to evenly flow in all the fingers in the widthwise direction of the transistor.

An MOSFET has another problem such that it is technically difficult to lower its high holding voltage. To make the fabrication cost for semiconductor devices low, it is necessary to increase (the protecting performance/layout area) ratio of an ESD protection device. However, reducing the layout area increases the resistance of the MOSFET, thereby lowering the protecting performance. There is a limit to reduction in the resistance of an MOSFET per unit area, thereby limiting an improvement on (the protecting performance/layout area) ratio.

In this respect, attention is being paid to an SCR (silicon controlled rectifier) type ESD protection device. The SCR type ESD protection device is described in, for example, U.S. Pat. No. 5,502,317 and IEEE Electron Device Letters, Volume 12, Issue 1, January 1991 p. 21 to 22, entitled "A low-voltage triggering SCR for on-chip ESD protection at output and input pads" by Chatterjee, A., Polgreen, T. The SCR type ESD protection device can allow a larger current to flow through it as compared with a protection device which uses an MOSFET.

The SCR-used ESD protection device is composed of an SCR which lets the electrostatic current flow and escape outside and a trigger current supplying circuit (hereinafter also simply called "trigger circuit") for latching the SCR. When a voltage to be applied to the trigger circuit exceeds a given value, the current starts to flow through the circuit. Various types of trigger circuits including the one that uses an NMOSFET have been devised.

The following will discuss first prior art which is an ESD protection device using a PN diode as the trigger current supplying circuit. FIG. 1 is a plan view showing the ESD protection device according to the first prior art, FIG. 2 is a cross-sectional view along line B–B' in FIG. 1 and FIG. 3 is an equivalent circuit diagram of the conventional ESD protection device. As shown in FIGS. 1 to 3, a $P^+$ substrate 101 of $P^+$ silicon is provided in the ESD protection device. An epitaxial layer 102 of $P^-$ silicon is formed on the $P^+$ substrate 101. An N well 104 is formed in the top surface of the epitaxial layer 102 and a P well 103 is formed in contact with the N well 104 in such a way as to surround the N well 104. A $P^+$ diffusion region 106, an $N^+$ diffusion region 107 and a $P^+$ diffusion region 110 are formed on the top surface of the P well 103 and a $P^+$ diffusion region 108 and an $N^+$ diffusion region 109 are formed on the top surface of the N well 104.

As shown in FIG. 1, the $P^+$ diffusion region 106, the $N^+$ diffusion region 107, the $P^+$ diffusion region 108, the $N^+$ diffusion region 109 and the $P^+$ diffusion region 110 are laid out in line in the named order as seen from the direction that is perpendicular to the surface of the $P^+$ substrate 101. Each diffusion region has a rectangular shape whose lengthwise direction is orthogonal to the layout direction of the individual diffusion regions. That is, the individual diffusion regions are laid out in parallel to one another. The lengths of the individual diffusion regions in the lengthwise direction are equal to one another. Further, a device isolation region 111 is formed in those regions of the top surface of the epitaxial layer 102 which exclude the individual diffusion regions.

As shown in FIGS. 2 and 3, the $P^+$ diffusion region 108, the N well 104 and the $P^+$ substrate 101 form a vertical PNP bipolar transistor 114 and the N well 104, the P well 103 and the N+ diffusion region 107 form a horizontal NPN bipolar transistor 115. The P well 103 is connected to the P+ substrate 101 via the epitaxial layer 102. With this structure, the base (N well 104) of the vertical PNP bipolar transistor 114 and the collector (N well 104) of the horizontal NPN bipolar transistor 115 are common to each other and the emitter (P+ substrate 101) of the vertical PNP bipolar transistor 114 and the base (P well 103) of the horizontal NPN bipolar transistor 115 are connected together. Further, the P+ diffusion region 108, the N well 104, the P well 103 and the N+ diffusion region 107 form a PNPN SCR and the P+ diffusion region 108 serves as the anode of this SCR while the N+ diffusion region 107 serves as the cathode of the SCR.

An input pad 112 is connected to the P+ diffusion region 108 or the anode, the N+ diffusion region 109 which is a well contact and a trigger circuit 113. The trigger circuit 113 is connected to the P+ diffusion region 106 which is a trigger tap. The N+ diffusion region 107 or the cathode is connected to a ground pad 116 and the P+ substrate 101 is also connected to the ground.

In the ESD protection device of the first prior art, when a positive surge current is input to the input pad 112, the trigger circuit 113 goes to an ON state to let the current flow to the P+ diffusion region 106 or the trigger tap. Accordingly, the current flows to a PN diode which is composed of the P well 103 and the N+ diffusion region 107, raising the potential at the bottom of the N+ diffusion region 107. Part of the electron current discharged from the N+ diffusion region 107 flows into the PN diode, while the rest flows into the N well 104 via the horizontal NPN bipolar transistor 115 and is absorbed by the N+ diffusion region 109 or the well contact.

As the current flows in the N well 104 at this time, a potential difference equivalent to the product (I×R) of the current value (I) and the resistance (R) is produced in the N well 104, thereby lowering the potential at that portion of the N well 104 which serves as the base of the vertical PNP bipolar transistor 114. This causes the current to flow between the collector (P+ diffusion region 108) and the emitter (P+ substrate 101) of the vertical PNP bipolar transistor 114 and the substrate potential increases as the current is supplied to the P+ substrate 101. As a result, the potential of the P well 103 (the base of the horizontal NPN bipolar transistor 115) connected to the P+ substrate 101 increases so that the horizontal NPN bipolar transistor 115 conducts further. This leads to further conduction of the vertical PNP bipolar transistor 114.

As such a phenomenon occurs, positive feedback occurs in the vertical PNP bipolar transistor 114 and the horizontal NPN bipolar transistor 115, thus forming a low-resistance current path between the anode (P+ diffusion region 108) and the cathode (N+ diffusion region 107). As the turn-on speed of the SCR depends on the distance between the anode and the cathode or the distance between the cathode and the N well, this distance is generally set to the minimum but is set larger in some case to adjust the holding voltage and holding current to high values.

A technique similar to the first prior art is disclosed in, for example, 1995 IEDM, p. 547–550 entitle "Substrate Triggering and Salicide Effects on ESD Performance and Protection Circuit Design in Deep Submicron CMOS Processes" by Ameraskera et al. and Japanese Patent Laid-Open No. 107074/1997. In Japanese Patent Laid-Open No. 107074/1997, an N type MOSFET is used as a circuit which supplies the substrate current and a circuit which connects the source of that MOSFET to a P+ diffusion region is used as a substrate bias circuit.

Another type of ESD protection device as described below has been proposed too. In an SCR type ESD protection device, the internal circuit also operates as an SCR due to ESD, causing a large current to flow in the ESD protection device which in turn may be thermally damaged. In this respect, the first prior art uses a P-on-P+ substrate which has a P− epitaxial silicon layer formed on a P+ silicon substrate to a thickness of about 3 to 5 μm. This design makes it hard for the ESD-originated flow of the current into the internal circuit. Accordingly, however, it becomes extremely difficult to trigger the SCR of the protection device. There may be a case of using a high-resistance substrate which has a P− epitaxial silicon layer grown on a P− silicon substrate. This design makes it easier to trigger the SCR of the protection device at a risk that the SCR of the protection device would be latched up by noise or the like at the time of the normal operation of the semiconductor device. To reduce the risk, an ESD protection device called a high-current trigger SCR whose trigger current to turn on the SCR (thyristor) is intentionally set high has been devised too. This high-current trigger SCR aims at avoiding a risk that the SCR would be latched during the operation of the LSI.

However, the conventional SCR type ESD protection device has the following problems. As the miniaturization of the CMOS-LSIs gain pace so the gate oxide film needs to become thinner. This lowers the breakdown voltage of the gate oxide film so that the gate oxide film is very susceptible to ESD. As reported by J. Wu et al. in "Breakdown and latent damage of ultra-thin gate oxides under ESD stress conditions", Electrical Overstress/Electrostatic Discharge Symposium Proceedings 2000, p. 287–295, for example, the conventional system called a low-voltage trigger SCR takes time for the SCR to have a low resistance after it is turned on. This may result in the overshooting of the voltage before the SCR is turned on, in which case the internal circuit may not be protected. With regard to low-resistance epitaxial substrates, in particular, there have been multiple reports that it is extremely difficult to latch SCRs.

In case of an MOSFET type protection device, the microfabrication of MOSFETs makes the gate length shorter, so that the protection device is turned on faster. Therefore, the response speed of the protection device does not matter. In case of an SCR type protection device, on the other hand, the turn-on speed depends on the distance between the anode and cathode of the SCR or the length of the current path. To improve the turn-on speed of the SCR, therefore, it is preferable to make the anode-cathode distance as short as possible. In order to secure the margin in the fabrication process and keep the isolation breakdown voltage, however, the SCR type protection device cannot have the anode-cathode distance set shorter than 0.6 to 1.0 μm, which limits the scale of micro-fabrication. This means that there is a limit to an improvement on the turn-on speed made by shortening the anode-cathode distance. Although the ESD protection device of the first prior art has the shortest anode-cathode distance allowable by the fabrication process, the turn-on speed is not sufficient. This is the reason why the response speed of the SCR has become an issue as mentioned in the aforementioned documents.

A device structure which optimizes the position for supplying the trigger current to an SCR in order to make the turn-on speed faster than the first prior art is described in Electrical Overstress/electrostatic Discharge Symposium Proceedings 2001, p. 22–31, "GGSCRs: GGNMOS triggered Silicon Controlled Rectifiers for ESD Protection in Deep Submicron CMOS Process" by Christian C. Russ et al. and U.S. patent application Ser. No. 2002/0053704. This ESD protection device will be discussed as second prior art.

FIG. 4 is a plan view showing an SCR type ESD protection device according to the second prior art. Same symbols are given to those structural elements shown in FIG. 4 which are identical to or correspond to the structural elements shown in FIGS. 1 to 3 to avoid repeating their detailed and redundant description. According to the second prior art, as shown in FIG. 4, the N+ diffusion region 107 or the cathode is separated into two between which the P+ diffusion region 106 or the trigger tap is located. The second prior art aims at latching the SCR more quickly by supplying the trigger current directly to the P well 103 or the base of the horizontal bipolar transistor 115. In the second prior art, the distance between the anode and cathode of the SCR is minimized too.

The N well pick-up diffusion in the N well is generally connected to the power supply to make it easier to latch the SCR. Such a protection device will be discussed as third prior art. FIG. 5 is a cross-sectional view of an SCR type ESD protection device according to the third prior art. Same symbols are given to those structural elements shown in FIG. 5 which are identical to or correspond to the structural elements shown in FIGS. 1 to 3 to avoid repeating their detailed and redundant description.

As shown in FIG. 5, the N+ diffusion region 109 or the well contact is connected to a power supply line 117 in the third prior art. This allows the substrate current to flow to the diode that is formed by the P well 103 and the N well 104, thus lowering the potential at that portion of the N well 104 which serves as the base of the vertical bipolar transistor 114. As a result, latching of the SCR becomes easier, thereby improving the protecting performance.

The surest way to prevent the latch-up of the SCR when the device is operating normally is to set the holding current and holding voltage needed to operate the SCR high. In this respect, an SCR called a holding-current controlled SCR has been proposed as described in Electrical Overstress/ electrostatic Discharge Symposium Proceedings 2002, p. 10–17 (FIG. 5), "High Holding Current SCRs (HHI-SCR) for ESD protection and Latch-up-Immune IC operation" by Markus P. J. et al. and U.S. patent application Ser. No. 2002/0153571. The disclosed schemes adjusts the level of the holding current by laying out a protection device in such a way that the N well resistance and/or the substrate resistance becomes lower, connecting an external resistor element of polysilicon to in series to at least one of the substrate resistor and the N well resistor and adjusting the resistance of the external resistor element.

The above-described prior arts have the following problems. While the second prior has an improvement on the position for supplying the trigger current, it has the same problems as the first prior art on the other portions, such as the diffusion regions in the N well. The second prior therefore has an insufficient effect of improving the turn-on speed.

The high-trigger-current SCR and holding-current controlled SCR should be designed to effectively reduce the well resistance in order to secure the noise immunity of the SCR. Like the first and second prior arts, therefore, the high-trigger-current SCR and holding-current controlled SCR suffer the extreme difficulty in triggering and insufficient turn-on speed. The triggering difficulty means that the size of the trigger current supplying device should be made larger, which increases the layout area and the parasitic capacitance.

While the technique of the third prior art is effective to some extent as a protection device for ESD from the input pad, it cannot be applied to ESD from the power supply.

The turn-on speed of the SCR may be increased by adjusting the impurity concentration in the diffusion regions or the like in an ESD protection device. From the viewpoint of the fabrication process, the impurity concentration in the ESD protection device should be set equal to the impurity concentration in the internal circuit as the protection target. That is, from the viewpoint of the fabrication cost for semiconductor devices, it is practically impossible to control parameters, such as the operation speed, by adjusting the impurity concentration in the ESD protection device separately from the impurity concentration in the internal circuit.

SUMMARY OF THE INVENTION

Accordingly, it is an object of the invention to provide an electrostatic discharge protection device which has a fast turn-on speed and can be used both as a protection device for an input pad and a protection device for a power supply, and an electrostatic discharge protection device which can increase the trigger current of an SCR so as to have a good noise immunity.

According to the invention, there is provided an electrostatic discharge protection device for protecting an internal circuit against electrostatic discharge applied externally. The electrostatic discharge protection device comprises an input pad connected to outside and the internal circuit; a trigger circuit which is connected to the input pad and in which a current flows when a voltage applied from the input pad exceeds a predetermined value; a first conductivity type semiconductor substrate; a second conductivity type well formed in a surface of the first conductivity type semiconductor substrate; a first first conductivity type diffusion region formed in that region of the surface of the first conductivity type semiconductor substrate which excludes the second conductivity type well and connected to the trigger circuit; a first second conductivity type diffusion region formed apart from both the second conductivity type well and the first first conductivity type diffusion region in the surface of the first conductivity type semiconductor substrate and connected to a reference potential electrode; a second first conductivity type diffusion region formed in a surface of the second conductivity type well and connected to the input pad; and second second conductivity type diffusion region formed in the surface of the second conductivity type well and connected to the input pad. And, a distance between the second first conductivity type diffusion region and the second second conductivity type diffusion region is non-uniform in a first direction orthogonal to a direction extending toward the second second conductivity type diffusion region from the second first conductivity type diffusion region.

According to the invention, the second first conductivity type diffusion region, the second conductivity type well and the first conductivity type semiconductor substrate form a vertical bipolar transistor, and the second conductivity type well, the first conductivity type semiconductor substrate and the first second conductivity type diffusion region form a horizontal bipolar transistor. The second first conductivity type diffusion region, the second conductivity type well, the first conductivity type semiconductor substrate and the first second conductivity type diffusion region form an SCR (thyristor). As electrostatic discharge is input to the input pad, the current flows into the trigger circuit and this current is input to the first first conductivity type diffusion region.

Accordingly, the current flows into a diode which is comprised of the first conductivity type semiconductor substrate and the first second conductivity type diffusion region and part of the current discharged from the first second conductivity type diffusion region flows into the second second conductivity type diffusion region in the second conductivity type well via the horizontal bipolar transistor. As the current flows into the second conductivity type well, a potential difference is produced to turn on the vertical bipolar transistor, thereby permitting the current flow. As a result, the potential of the first conductivity type semiconductor substrate changes and the horizontal bipolar transistor conducts further, thus forming a low-resistance current path between the second first conductivity type diffusion region and the first second conductivity type diffusion region.

At this time, because the distance between the second first conductivity type diffusion region and the second second conductivity type diffusion region is not uniform in the first direction at the stage where the vertical bipolar transistor is turned on, the potential difference between the second first conductivity type diffusion region and the second second conductivity type diffusion region becomes greater at that portion of the second first conductivity type diffusion region which has a large distance with respect to the second second conductivity type diffusion region, so that the vertical bipolar transistor becomes easier to be latched there. As a result, the turn-on speed of the SCR is improved. The electrostatic discharge protection device according to the invention can be connected to the input terminal of the internal circuit as well as the power supply terminal, so that the internal circuit can be protected against both electrostatic discharge coming from the input terminal and electrostatic discharge coming from the power supply terminal. As apparent from the above, the invention can improve the turn-on speed of the SCR by properly selecting the shape and layout position of the second second conductivity type diffusion region. This can provide an electrostatic discharge protection device which has a fast turn-on speed and is easily triggered even if the well resistance and the substrate resistance are lowered to improve the noise immunity of the SCR.

It is preferable that the second second conductivity type diffusion region should be formed in such a position as to sandwich the second first conductivity type diffusion region together with the second first conductivity type diffusion region, and a length in the first direction in the second second conductivity type diffusion region should be shorter than a length in the first direction in the second first conductivity type diffusion region. This design can make the distance between the second first conductivity type diffusion region and the second second conductivity type diffusion region is non-uniform without increasing the circuit area.

It is also preferable that one of the first second conductivity type diffusion region and the second second conductivity type diffusion region should have a rectangular shape and at least two sides of that one diffusion region should face the other diffusion region. This design can reduce the resistance between the first second conductivity type diffusion region and the second second conductivity type diffusion region and can thus improve the noise immunity. In general, reducing the resistance between those two regions makes it difficult to turn on the SCR while the noise immunity is improved. The structure of the invention however makes it easier to trigger the SCR.

Further, it is preferable that the second first conductivity type diffusion region should have a main portion located between the first second conductivity type diffusion region and the second second conductivity type diffusion region; and an extending portion extending from the main portion in a direction toward the second second conductivity type diffusion region. This can make the anode larger to increase the substrate current.

Furthermore, it is preferable that the second first conductivity type diffusion region should have a comb-like shape having a proximal end portion extending in the first direction and a plurality of distal end portions extending from the proximal end portion in a second direction orthogonal to the first direction, and the second second conductivity type diffusion region should be located between the distal end portions. This structure can make the area of the second first conductivity type diffusion region larger than the area of the second second conductivity type diffusion region. As a result, the effective well resistance becomes lower and the trigger current becomes greater, making it possible to reduce the risk that the SCR would be latched due to the influence of the substrate noise or the like at the time the LSI operates. Alternatively, it is preferable that the second second conductivity type diffusion region should have a comb-like shape having a proximal end portion extending in the first direction and a plurality of distal end portions extending from the proximal end portion in a second direction orthogonal to the first direction, and the second first conductivity type diffusion region should be located between the distal end portions. Apparently, the invention can reduce the well resistance of the SCR to improve the noise immunity by properly selecting the shapes and layout positions of the second first conductivity type diffusion region and the second second conductivity type diffusion region.

It is also preferable that the first first conductivity type diffusion region, the first second conductivity type diffusion region, the second first conductivity type diffusion region and the second second conductivity type diffusion region should be laid out in a named order. With the design, the current that flows to the second second conductivity type diffusion region from the first second conductivity type diffusion region always passes the second first conductivity type diffusion region or the underlying region, so that the non-uniform potential in the second first conductivity type diffusion region or the underlying region makes it easier to turn on the SCR.

As elaborated above, the invention can make it easier to latch the vertical bipolar transistor and improve the turn-on speed of the SCR by setting the distance between the second first conductivity type diffusion region which is the anode and the second second conductivity type diffusion region which is the well contact non-uniform. It is therefore possible to prove an electrostatic discharge protection device capable of protecting the internal circuit reliably.

DETAILED DESCRIPTION OF THE PREFERRED EMBODIMENTS

Figure 1:
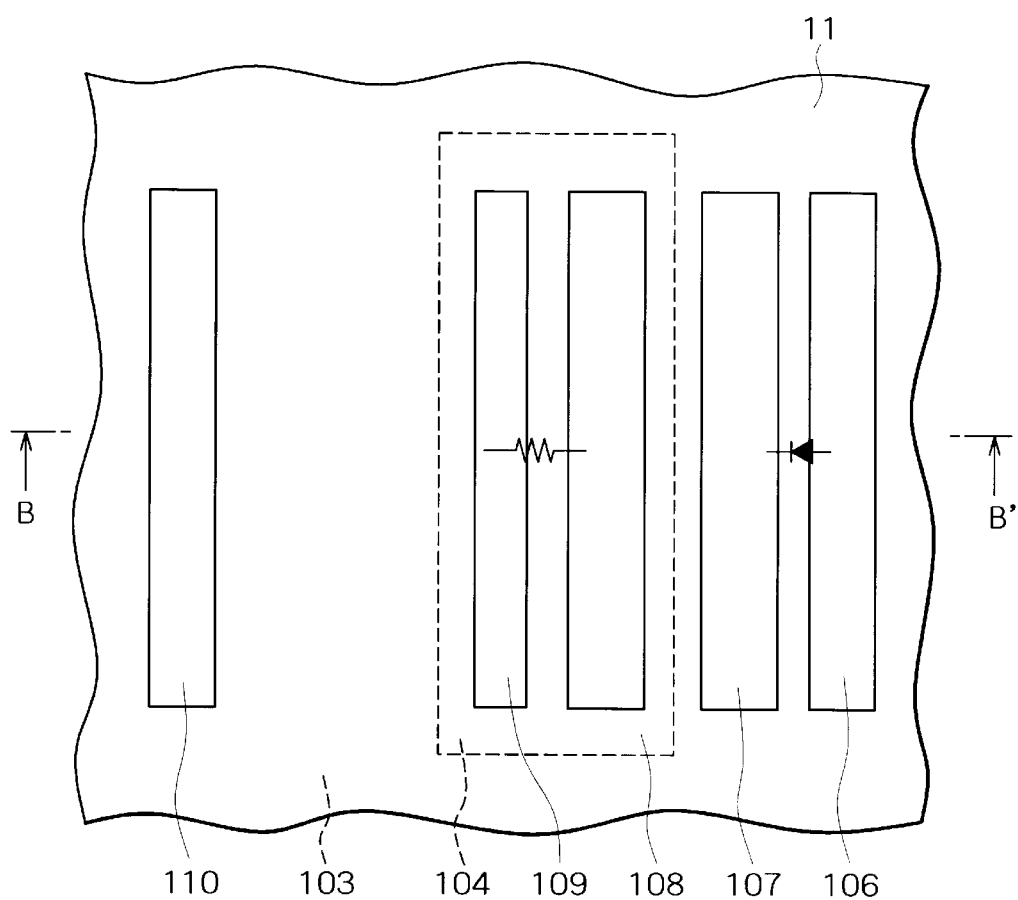
FIG. 1 is a plan view showing an ESD protection device according to the first prior art.
Figure 2:
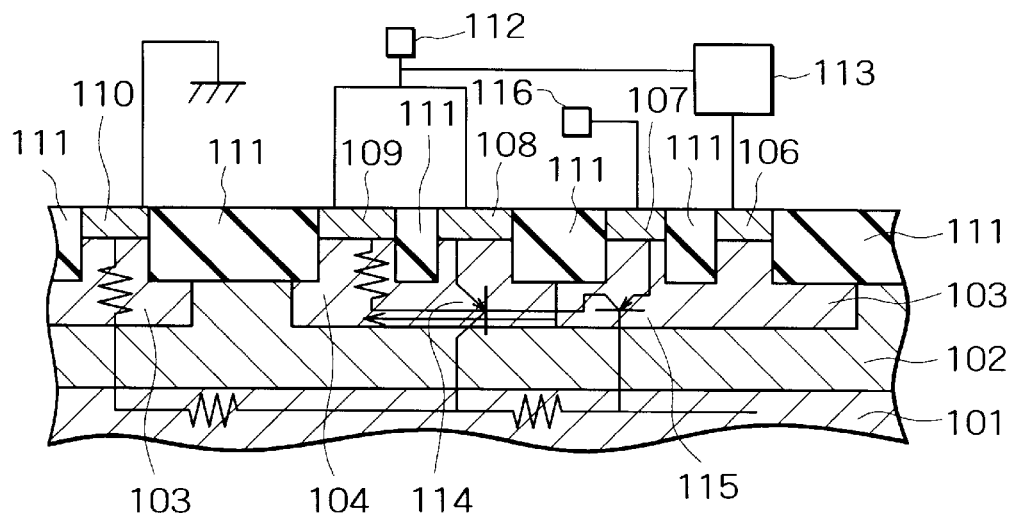
FIG. 2 is a cross-sectional view along line B–B' in FIG. 1.
Figure 3:
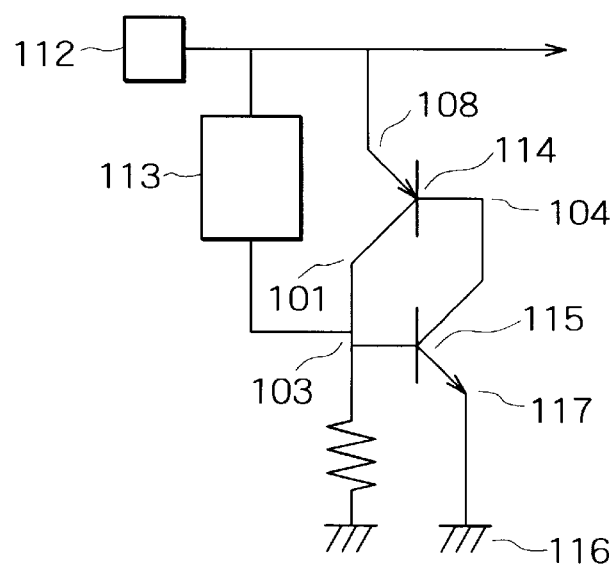
FIG. 3 is an equivalent circuit diagram of the conventional ESD protection device.
Figure 4:
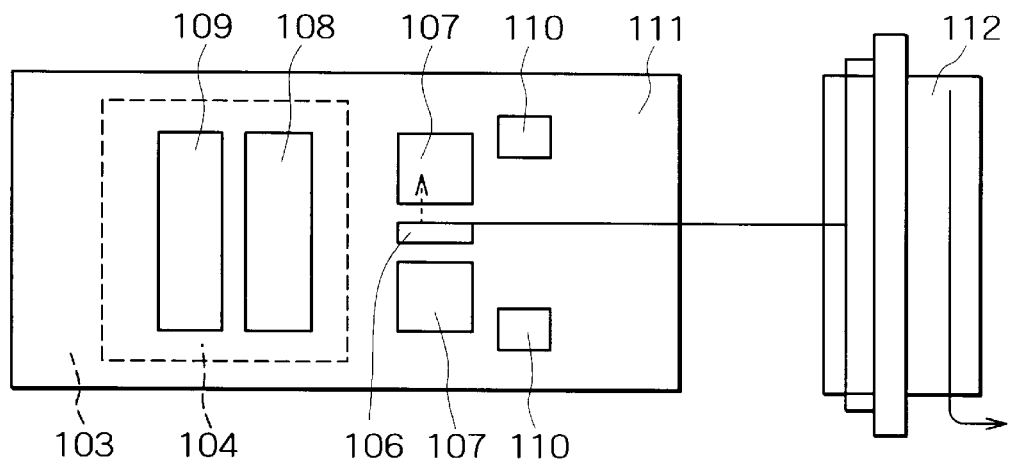
FIG. 4 is a plan view showing an SCR type ESD protection device according to the second prior art.
Figure 5:
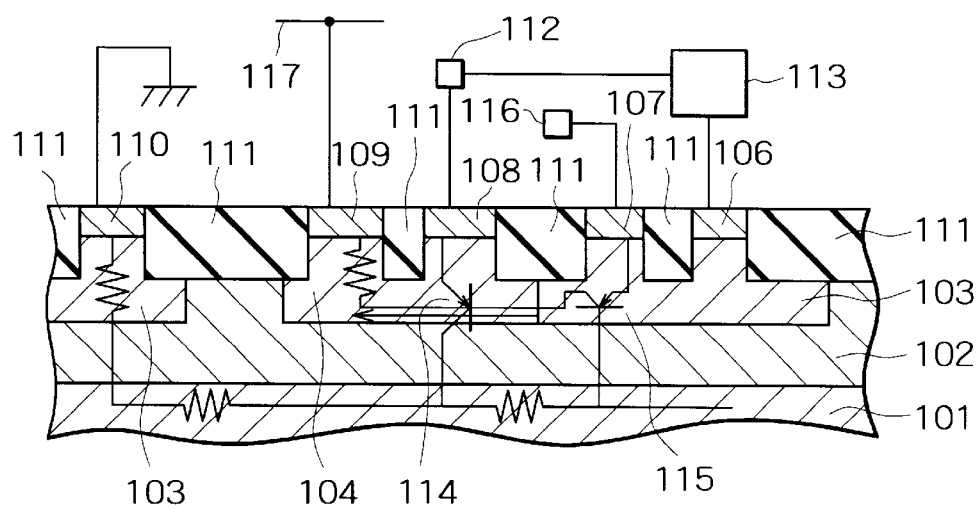
FIG. 5 is a cross-sectional view of an SCR type ESD protection device according to the third prior art.
Figure 6:
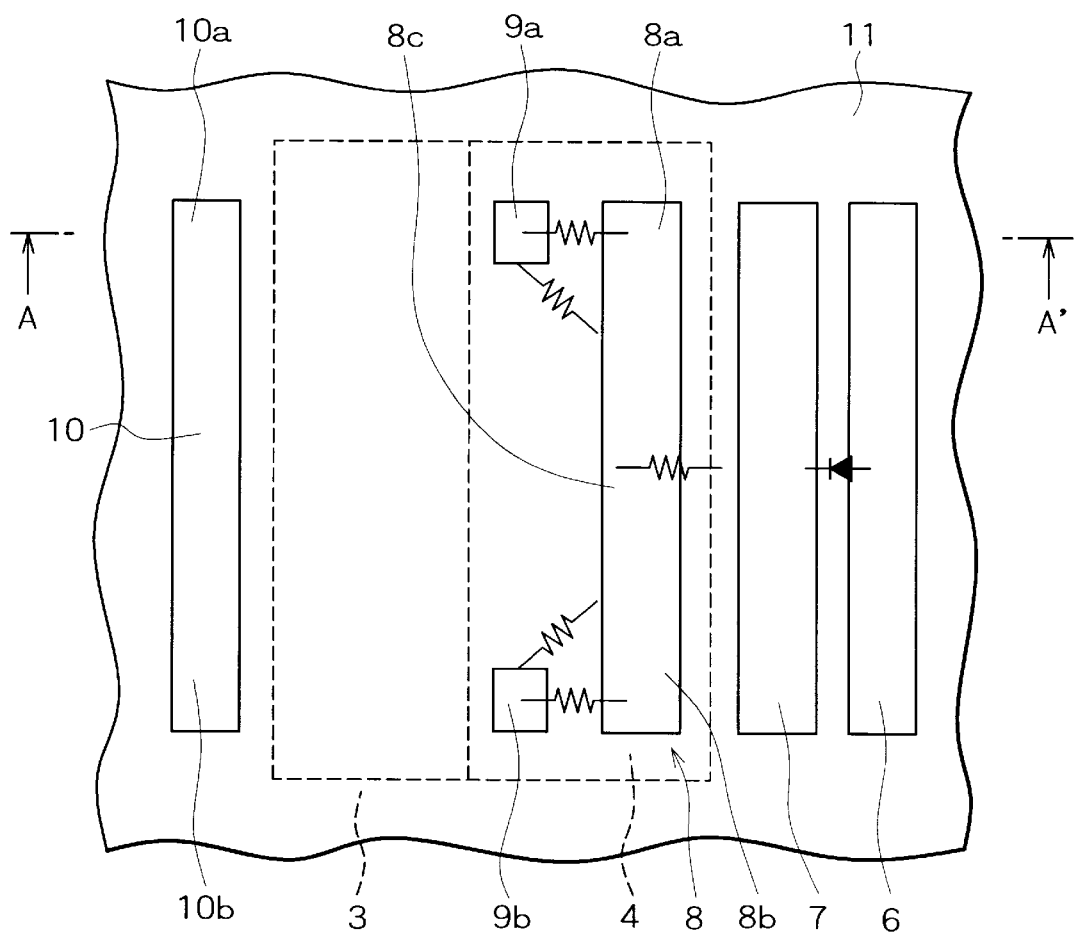
FIG. 6 is a plan view showing an ESD protection device according to a first embodiment of the invention.
Figure 7:
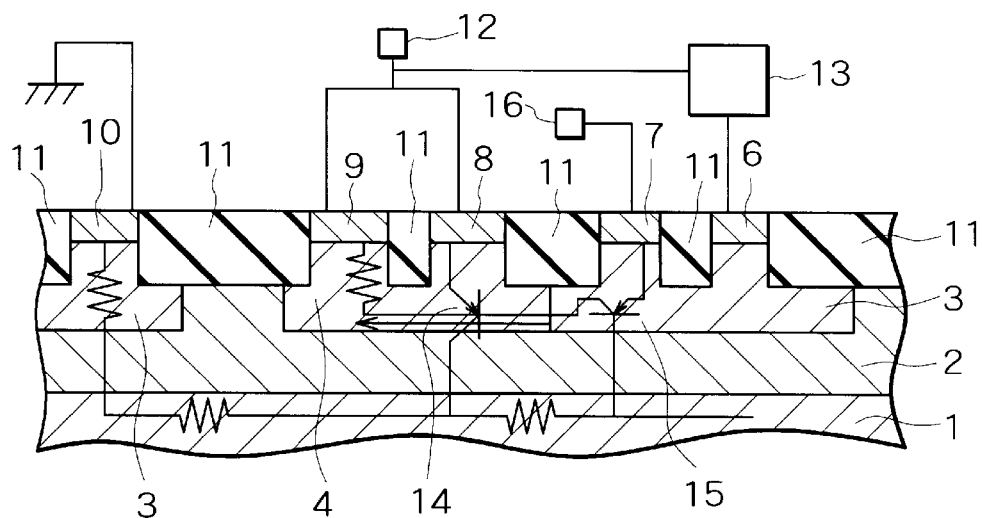
FIG. 7 is a cross-sectional view along line A–A' in FIG. 6.
Figure 8:
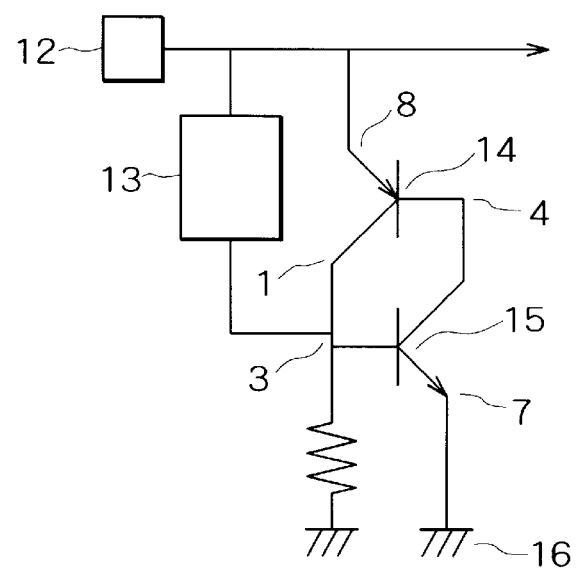
FIG. 8 is an equivalent circuit diagram of the ESD protection device according to the embodiment.

Preferred embodiments of the invention will specifically be described below with reference to the accompanying drawings. The first embodiment of the invention will be described first. FIG. 6 is a plan view showing an electrostatic discharge (ESD) protection device according to the embodiment, FIG. 7 is a cross-sectional view along line A–A' in FIG. 6 and FIG. 8 is an equivalent circuit diagram of the ESD protection device. The ESD protection device according to the embodiment is an on-chip protection device which protects the internal circuit from electrostatic discharge applied externally.

As shown in FIGS. 6 and 7, a $P^+$ substrate 1 is provided in the ESD protection device according to the first embodiment. An epitaxial layer 2 is formed on the $P^+$ substrate 1. An N well 4 is formed in the top surface of the epitaxial layer 2 and a P well 3 is formed in contact with the N well 4 in such a way as to surround the N well 4. A $P^+$ diffusion region 6, an $N^+$ diffusion region 7 and a $P^+$ diffusion region 10 are formed on the top surface of the P well 3 and a $P^+$ diffusion region 8 and two $N^+$ diffusion regions 9a and 9b are formed on the top surface of the N well 4.

As shown in FIG. 6, the $P^+$ diffusion region 6, the $N^+$ diffusion region 7, the $P^+$ diffusion region 8 and the $P^+$ diffusion region 10 are laid out in line in the named order as seen from the direction that is perpendicular to the surface of the $P^+$ substrate 1. Each of the $P^+$ diffusion region 6, the $N^+$ diffusion region 7, the $P^+$ diffusion region 8 and the $P^+$ diffusion region 10 diffusion region has a rectangular shape whose lengthwise direction is orthogonal to the layout direction of the diffusion regions 6, 7, 8 and 10. That is, the diffusion regions 6, 7, 8 and 10 are laid out in parallel to one another. The lengths of the diffusion regions 6, 7, 8 and 10 in the lengthwise direction are equal to one another. The shapes of the two $N^+$ diffusion regions 9a and 9b (hereinafter also generally called "$N^+$ diffusion region 9") are rectangular and the total length of the $N^+$ diffusion regions 9a and 9b in the lengthwise direction of the diffusion regions 6, 7, 8 and 10 is shorter than the lengthwise length of the $P^+$ diffusion region 8. The $N^+$ diffusion region 9a is laid between one end portion 8a of the $P^+$ diffusion region 8 in the lengthwise direction and one end portion 10a of the $P^+$ diffusion region 10 positioned on that side of the one end portion 8a, and the $N^+$ diffusion region 9b is laid between the other end portion, 8b, of the $P^+$ diffusion region 8 in the lengthwise direction and the other end portion, 10b, of the $P^+$ diffusion region 10 positioned on that side of the other end portion 8b. The $N^+$ diffusion regions 9a and 9b are located at the corner portions of the N well 4.

Accordingly, both end portions 8a and 8b of the $P^+$ diffusion region 8 are closer to the $N^+$ diffusion regions 9a and 9b, respectively, and a center portion 8c of the $P^+$ diffusion region 8 is located farther from the $N^+$ diffusion region 9 than the portions 8a and 8b. That is, the portion 8c has a distance from the $N^+$ diffusion region 9 effectively set longer than the portions 8a and 8b, and the distance between the $P^+$ diffusion region 8 and the $N^+$ diffusion region 9 is not uniform in the lengthwise direction of the $P^+$ diffusion region 8. Accordingly, the resistance between the portion 8c and the $N^+$ diffusion region 9 becomes higher than the resistance between the portions 8a and 8b and the $N^+$ diffusion region 9.

The $P^+$ diffusion region 6, the $N^+$ diffusion region 7, the $P^+$ diffusion region 8, the $N^+$ diffusion regions 9a and 9b and the $P^+$ diffusion region 10 are laid out apart from one another. A device isolation region 11 is formed in those regions of the top surface of the epitaxial layer 2 which exclude the individual diffusion regions.

As shown in FIGS. 7 and 8, the $P^+$ diffusion region 8, the N well 4 and the $P^+$ substrate 1 form a vertical PNP bipolar transistor 14 and the N well 4, the P well 3 and the $N^+$ diffusion region 7 form a horizontal NPN bipolar transistor 15. The P well 3 is connected to the $P^+$ substrate 1 via the epitaxial layer 2. Therefore, the base (N well 4) of the vertical PNP bipolar transistor 14 and the collector (N well 4) of the horizontal NPN bipolar transistor 15 are common to each other and the emitter ($P^+$ substrate 1) of the vertical PNP bipolar transistor 14 and the base (P well 3) of the horizontal NPN bipolar transistor 15 are connected together. That is, the vertical PNP bipolar transistor 14 and the horizontal NPN bipolar transistor 15 are telescopic to each other. Further, the $P^+$ diffusion region 8, the N well 4, the P well 3 and the $N^+$ diffusion region 7 form a PNPN SCR and the $P^+$ diffusion region 8 serves as the anode of this SCR while the $N^+$ diffusion region 7 serves as the cathode of the SCR. The $N^+$ diffusion region 9 serves as an N well pick-up diffusion.

An input pad 12 is connected to an internal circuit (not shown) to protect, the $P^+$ diffusion region 8 or the anode, the $N^+$ diffusion region 9 or the well contact and a trigger circuit 13. In other words, the anode and the well contact are short-circuited and connected to the input pad 12. The trigger circuit 13 is connected to the $P^+$ diffusion region 6 which is a trigger tap. The $N^+$ diffusion region 7 or the cathode is connected to a ground pad 16 and the $P^+$ substrate 1 is also connected to the ground via the $P^+$ diffusion region 10. The trigger circuit 13 is comprised of, for example, a PN diode. The internal circuit to protect is, for example, a CMOS LSI.

The $P^+$ diffusion region 6 and the trigger circuit 13, the $N^+$ diffusion region 7 and the ground pad 16, the P+diffusion region 8 and the $N^+$ diffusion region 9, the input pad 12 and the trigger circuit 13, and the $P^+$ diffusion region 10 and the ground are respectively connected via a plurality of contact holes (not shown) provided in the individual diffusion regions. Silicides are formed on the surfaces of the individual diffusion regions. This is true of the other embodiments which will be discussed later.

The operation of the ESD protection device according to the embodiment will be discussed below. As shown in FIGS. 6 to 8, in the ESD protection device of the embodiment, when electrostatic discharge causes a positive surge current to be input to the input pad 12, the trigger circuit 13 goes to an ON state to let the current flow to the P+ diffusion region 6 or the trigger tap. Accordingly, the current flows to a PN diode which comprises the P well 3 and the N+ diffusion region 7, raising the potential at the bottom of the N+ diffusion region 7. At this time, the electron current which is discharged from the N+ diffusion region 7 is uniform in the lengthwise direction of the N+ diffusion region 7. Part of the electron current flows into the PN diode, while the rest flows into the N well 4 via the horizontal NPN bipolar transistor 15 and is absorbed by the N+ diffusion region 9 or the well contact. As the current flows in the N well 4 at this time, a potential difference equivalent to the product (I×R) of the current value (I) and the resistance (R) is produced in the N well 4, thereby lowering the potential at that portion of the N well 4 which serves as the base of the vertical PNP bipolar transistor 14. As a result, the vertical PNP bipolar transistor 14 is latched into an ON state and the current flows between the collector (P+0 diffusion region 8) of the vertical PNP bipolar transistor 14 and the emitter (P+ substrate 1) thereof.

Because the distance between the portion 8c equivalent to the center portion of the P+ diffusion region 8 and the N+ diffusion region 9 is greater than the distances between the portions 8a and 8b equivalent to both end portions of the P+ diffusion region 8 and the N+ diffusion region 9 at this time, the well resistance between the portion 8c and the N+ diffusion region 9 becomes higher than the well resistance between the portion 8a and the N+ diffusion region 9a and the well resistance between the portion 8b and the N+ diffusion region 9b. This makes the potential difference between the portion 8c and the N+ diffusion region 9 greater than the potential differences between the portions 8a and 8b and the N+ diffusion region 9. It therefore becomes easier to latch the vertical PNP bipolar transistor 14 in the portion 8c. As a result, the turn-on speed of the SCR is improved. Note that the distribution of the current flowing in the vertical PNP bipolar transistor 14 becomes non-uniform at this time.

As the current flows in the vertical PNP bipolar transistor 14 and the current is supplied to the P+ substrate 1, the substrate potential increases. As a result, the potential of the P well 3 (the base of the horizontal NPN bipolar transistor 15) connected to the P+ substrate 1 increases so that the horizontal NPN bipolar transistor 15 conducts further. This leads to further conduction of the vertical PNP bipolar transistor 14. As a consequence, positive feedback occurs in the vertical PNP bipolar transistor 14 and the horizontal NPN bipolar transistor 15, thus forming a low-resistance current path in the SCR that is comprised of the P+ diffusion region 8 (anode), the N well 4, the P well 3 and the N+ diffusion region (cathode).

According to the embodiment, as described above, the N+ diffusion region 9 is patterned to have a smaller shape and is provided at two locations and the distance between the P+ diffusion region 8 (anode) and the N+ diffusion region 9 (N well pick-up diffusion) is made non-uniform, thereby providing the portion 8c whose effective distance from the N+ diffusion region 9 is long. This increases the potential difference between the portion 8c and the N+ diffusion region 9, so that latching of the vertical PNP bipolar transistor 14 becomes easier and the turn-on speed of the PNPN SCR formed by the P+ diffusion region 8, the N well 4, the P well 3 and the N+ diffusion region 7 is improved. As a result, when electrostatic discharge is externally applied to the input pad 12, the SCR is turned on quickly to let the electrostatic discharge escape outside and reliably protect the internal circuit. In addition, the ESD protection device according to the embodiment can be connected to the input terminal of the internal circuit as well as the power supply terminal, so that the internal circuit can be protected against both electrostatic discharge coming from the input terminal and electrostatic discharge coming from the power supply terminal.

The reason why the layout of the planar diffusion regions in the structure of the SCR type ESD protection device was not optimized in the prior arts unlike in the embodiment is that, as inferred from the above-described case of the MOSFET type ESD protection device, it was the general thought that letting the current flow evenly in the widthwise direction of the SCR would increase the breakdown current at which the device itself would be damaged and would therefore lead to a higher protecting performance. Conventionally, therefore, no schemes to intentionally make the electrode layout uneven as in the invention has not been considered. With regard to the SCR, however, it is considered more important in the invention to improve the turn-on speed than to increase the breakdown current and the structure of the SCR type ESD protection device is so designed as to give priority to the turn-on speed over the breakdown current. This design could provide an SCR type ESD protection device with a greater protecting performance than the conventional one.

The ESD protection devices described in Japanese Patent Laid-Open No. 107074/1997 and U.S. patent application Ser. No. 2002/0153571, both discussed in the DESCRIPTION OF THE RELATED ART, for example, do not employ the design of the ESD protection device of the embodiment wherein the resistance between the anode and the N well pick-up diffusion is made uneven and is set to the maximum in the path along which the trigger current flows. Therefore, the conventional ESD protection devices have a slower turn-on speed. In the ESD protection device described in the patent document 5, particularly, the substrate electrode of the SCR and the electrode which fixes the potential of the N well are so arranged as to face each other, so that the electron current from the triggering PN diode which is formed by the cathode and the triggering P+ tap (which also serves as the electrode to fix the substrate potential) flows directly to the N well pick-up diffusion, making the trigger current extremely high. In the ESD protection device of the embodiment, by way of contrast, properly selecting the layout of the individual electrodes allows the trigger current to flow into the substrate and turns on the SCR so that the trigger current can be made smaller.

In case where the holding voltage and the resistance of the SCR depend on the resistance of the N well 4, the holding voltage becomes lower at that portion of the N well 4 between the P+ diffusion region 8 and the N+ diffusion region which has a high resistance. In case where the current value is close to the held current value, the current distribution becomes non-uniform in the widthwise direction and the current becomes greater at the center portion in the widthwise direction of the SCR. In the high-current region where the SCR operates, however, the PN junction is forward-biased over the entire area between the anode (P+ diffusion region 8) and the cathode (N+ diffusion region 7). Therefore, the ratio of the current directly flowing to the anode or the cathode increases in both the electron current and the hole current, so that the current becomes relatively uniform. This leads to a low possibility that the non-uniformess of the N well resistance and the substrate resistance would reduce the breakdown current. In case where a high current flows in the ESD protection device, the non-uniformness of the current can be corrected by increasing the resistance of the portion where the current flows (e.g., the center portion).

In the ESD protection device of the embodiment, a silicide block region where a silicide is not formed may be provided on the surfaces of the P+ diffusion region 8 and the N+ diffusion region 7 in order to make the resistance between the anode (P+ diffusion region 8) and the cathode (N+ diffusion region 7) uniform in the widthwise direction. This increases the resistance in the silicide block region so that the uniform resistance can be ensured. It is to be noted however that the silicide block region is not essential because, as mentioned above, there is a low possibility that the non-uniformess of the N well resistance and the substrate resistance would lower the breakdown current.

Figure 9:
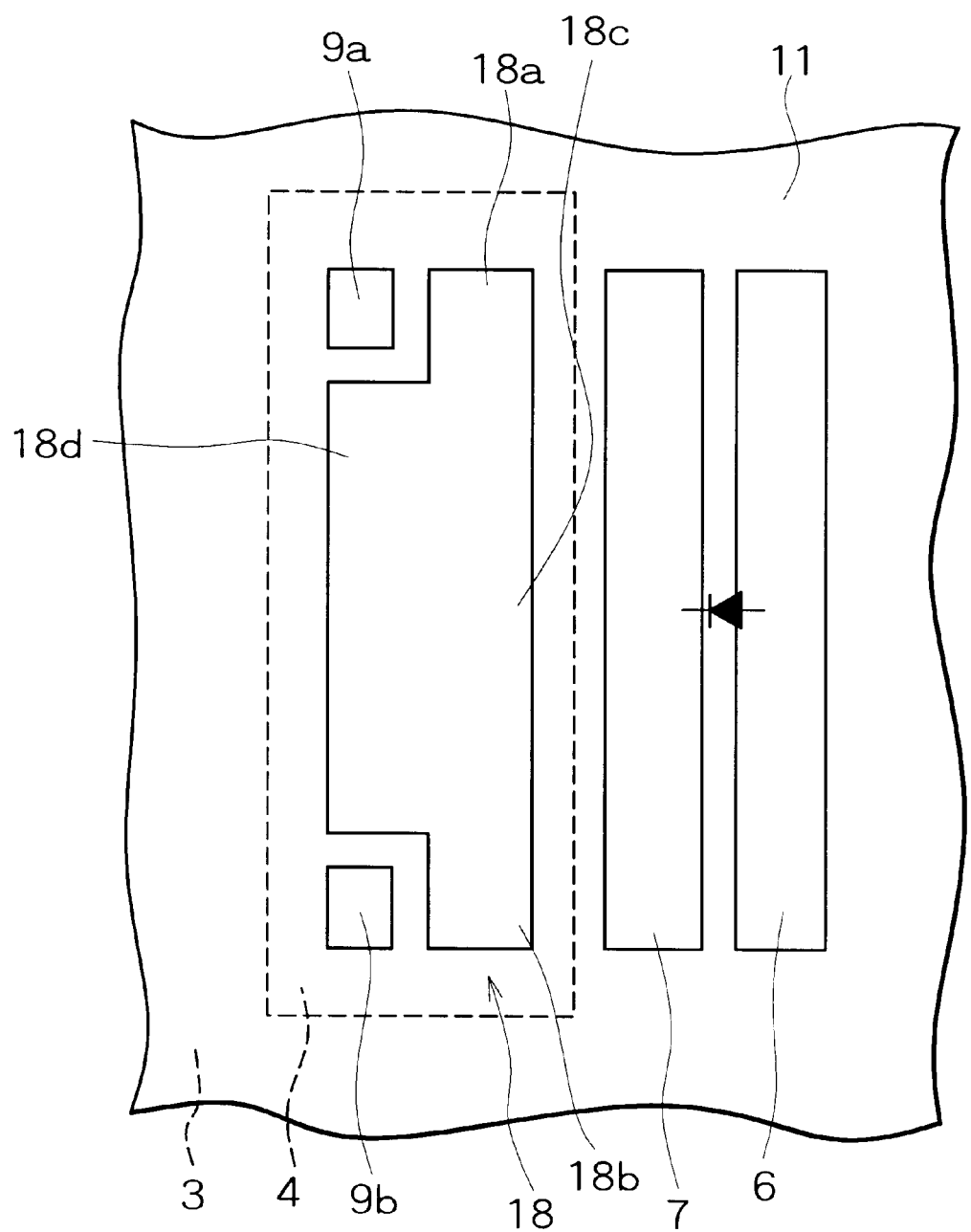
FIG. 9 is a plan view showing an ESD protection device according to a second embodiment of the invention.

The second embodiment of the invention will be discussed next. FIG. 9 is a plan view showing an ESD protection device according to the embodiment. Same symbols are given to those structural elements of the embodiment shown in FIG. 9 which are identical to or correspond to the structural elements of the first embodiment to avoid repeating their detailed and redundant description. It is to be noted that the P+ diffusion region 10 is omitted in the diagram.

As shown in FIG. 9, a P+ diffusion region 18 is provided as the anode in the second embodiment in place of the P+ diffusion region 8 (see FIG. 6) of the first embodiment. The P+ diffusion region 18 is provided with portions 18a and 18b equivalent to both widthwise end portions, a center portion 18c located between the portions 18a and 18b and an extending portion 18d extending from the portion 18c to the area between the N+ diffusion regions 9a and 9b along the layout direction of the diffusion regions 6, 7, 8 and 10. The other structure of the ESD protection device of the embodiment than the one discussed above is the same as that of the ESD protection device of the first embodiment.

As the shape of the anode (P+ diffusion region 18) in the embodiment is designed larger than that in the first embodiment, the substrate current can be increased. The other advantages of the embodiment than this one are the same as those of the first embodiment.

Figure 10:
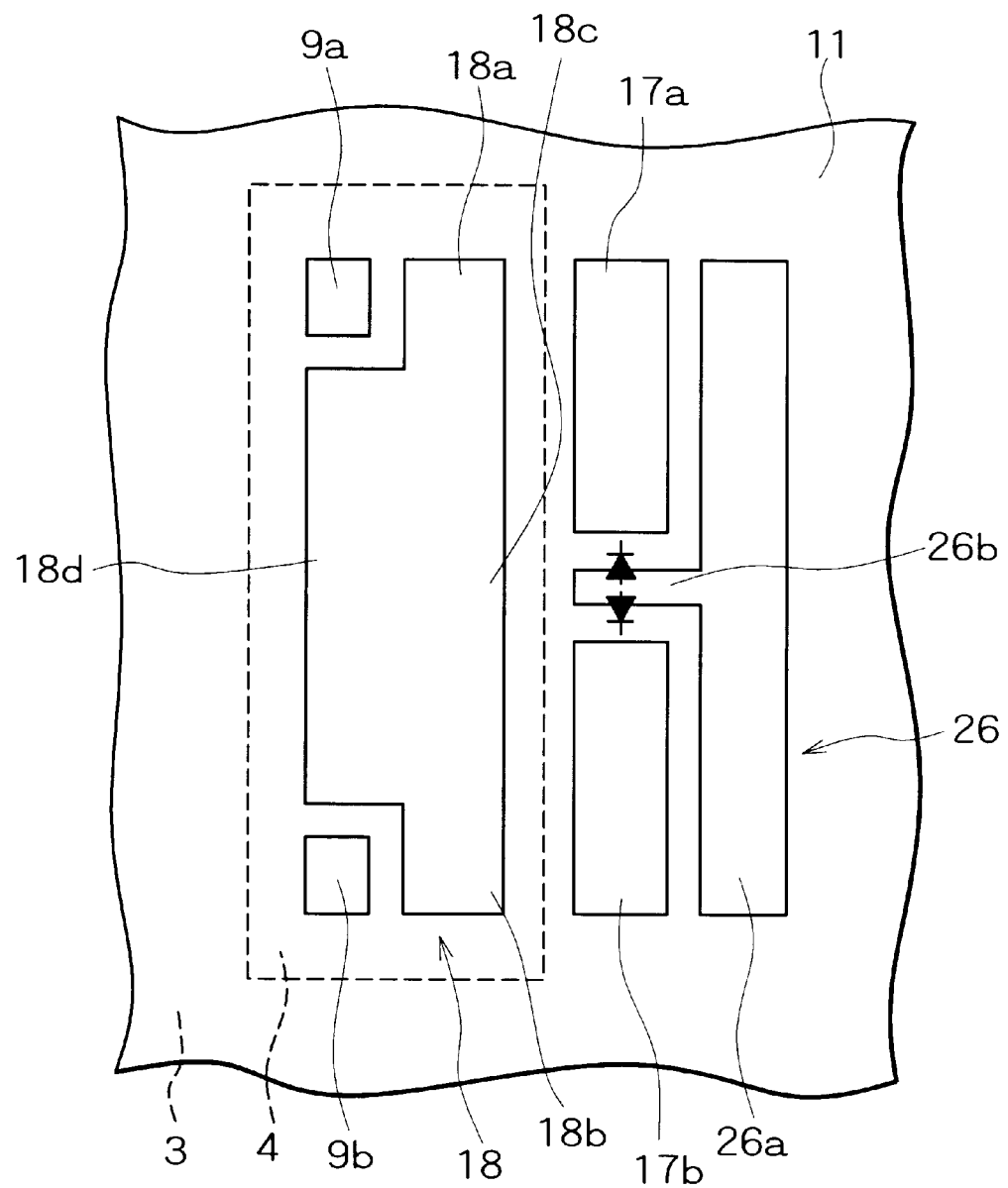
FIG. 10 is a plan view showing an ESD protection device according to a third embodiment of the invention.

The third embodiment of the invention will be discussed next. FIG. 10 is a plan view showing an ESD protection device according to the embodiment. This embodiment is the combination of the second embodiment and the above-described technique of the second prior art. Same symbols are given to those structural elements of the embodiment shown in FIG. 10 which are identical to or correspond to the structural elements of the second embodiment to avoid repeating their detailed and redundant description. It is to be noted that the P+ diffusion region 10 is not illustrated in the diagram.

As shown in FIG. 10, two N+ diffusion regions 17a and 17b separated from each other are provided as the cathode in the ESD protection device of the embodiment in place of the N+ diffusion region 7 (see FIG. 9) in the first and second embodiments. Further, a P+ diffusion region 26 is provided as a trigger tap instead of the P+ diffusion region 6 (see FIG. 9) in the first and second embodiments. The P+ diffusion region 26 is provided with a rectangular portion 26a which has the same shape and at the same position as the P+ diffusion region 6 in the first and second embodiments and an extending portion 26b which extends from the center portion of the rectangular portion 26a and is located between the N+ diffusion regions 17a and 17b. The other structure of the ESD protection device of the embodiment than the one discussed above is the same as that of the ESD protection device of the second embodiment.

Because the electron current is generated from the extending portion 26b of the P+ diffusion region 26 located between the N+ diffusion regions 17a and 17b which mainly serve as the cathode in the embodiment, the resistance of the current path to the N well pick-up diffusion (N+ diffusion region 9) can be increased. That is, the combination of the second embodiment and the second prior art can provide a greater protecting effect than the first and second embodiment can.

Figure 11:
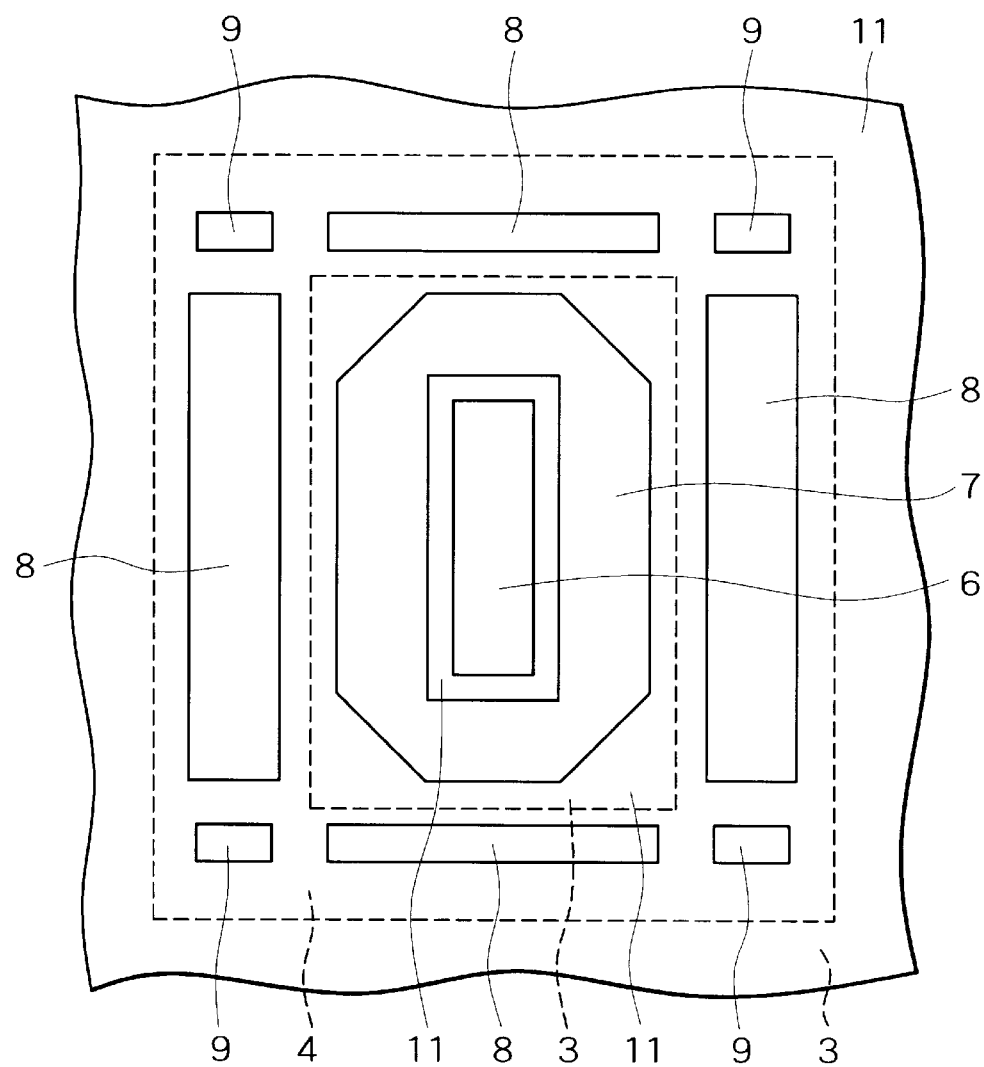
FIG. 11 is a plan view showing an ESD protection device according to a fourth embodiment of the invention.

The fourth embodiment of the invention will be discussed next. FIG. 11 is a plan view showing an ESD protection device according to the embodiment. Same symbols are given to those structural elements of the embodiment shown in FIG. 11 which are identical to or correspond to the structural elements of the first embodiment to avoid repeating their detailed and redundant description. It is to be noted that the P+ diffusion region 10 is omitted in the diagram.

As shown in FIG. 11, the N+ diffusion region 7 serving as the cathode is laid out in such a way as to surround the P+ diffusion region 6 or the trigger tap in the ESD protection device of the embodiment. The N well 4 is laid out in such a way as to surround the N+ diffusion region 7. The N well 4 has the shape of a rectangular frame. Four P+ diffusion regions 8 which serve as the anode are respectively laid at four locations, one at each of the four sides of the frame-shaped N well 4. Each P+ diffusion region 8 has a rectangular shape whose lengthwise direction is the same as the direction in which the individual sides of the N well 4 extend. The individual P+ diffusion regions 8 are arranged in such positions as to sandwich the N+ diffusion region 7 together with the P+ diffusion region 6. The N+ diffusion regions 9 are formed at the four corners of the N well 4. That is, the N+ diffusion regions 9 are laid out at four locations. The other structure of the ESD protection device of the embodiment than the one discussed above is the same as that of the ESD protection device of the first embodiment.

In the embodiment, the substrate potential of the entire region where the SCR is formed can be increased efficiently by arranging the N well 4 as the substrate current source in such a way as to surround the P+ diffusion region 6 and the N+ diffusion region 7. This further improves the protecting performance of the ESD protection device. This embodiment is particularly effective when the N well pick-up diffusion and the cathode are connected to the same input line.

Figure 12:
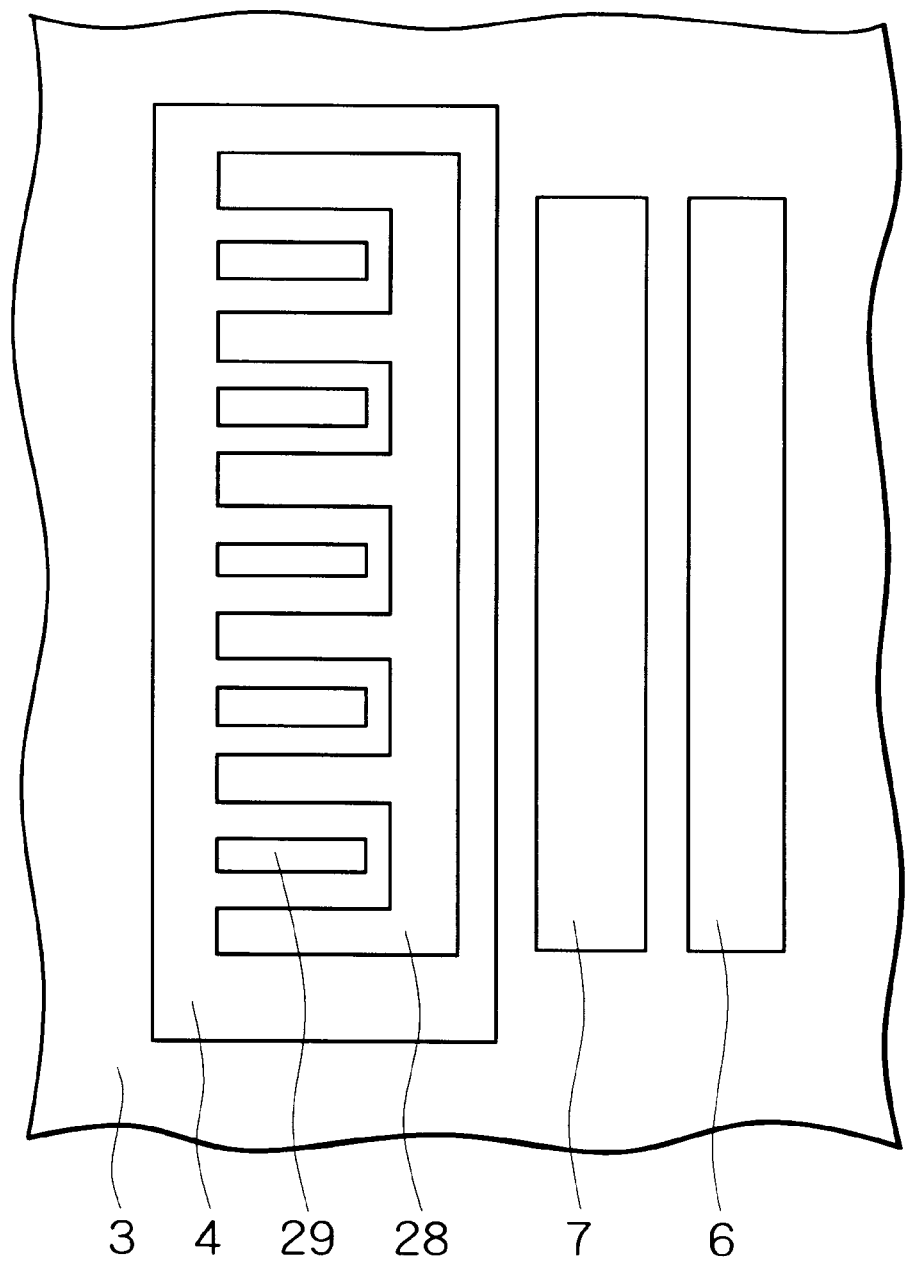
FIG. 12 is a plan view showing an ESD protection device according to a fifth embodiment of the invention.

The fifth embodiment of the invention will be discussed below. FIG. 12 is a plan view showing an ESD protection device according to the embodiment. The SCR of the ESD protection device according to the embodiment relates to a high-current trigger SCR. Unlike the SCRs of the first to fourth embodiments, the SCR of this embodiment has a comb-like shape with a proximal end portion extending in the widthwise direction of the SCR and a plurality of distal end portions extending in the direction along which the current in the SCR flows from the proximal end portion and has well contacts (N+ diffusion region 29) arranged between the distal end portions. STI is not formed between the anode and the well contact and isolation between both impurity diffusion regions is achieved by adjusting the distance between the impurity diffusion regions in the photoresist process.

With the anode and the well contact arranged in the aforementioned manner, the area of the anode (P+ diffusion region 28) is larger than the area of the well contact (N+ diffusion region 9) in the embodiment. As no STI is formed, the resistance between the anode and the well contact can be reduced. Those effects set the effective well resistance extremely lower to increase the trigger current. This can reduce the risk that the SCR would be latched by the substrate noise or the like at the time the LSI operates.

Although the foregoing description of the fifth embodiment has been given of the case where the well resistance is reduced without forming STI, the provision of STI between both the N well pick-up diffusion (N$^+$ diffusion region 9) and the anode (P$^+$ diffusion region 28) may be needed in a case where the N well pick-up diffusion and the anode should be isolated from each other. Although the well resistance is reduced in the embodiment, the substrate resistance of the SCR may be reduced instead.

Figure 13:
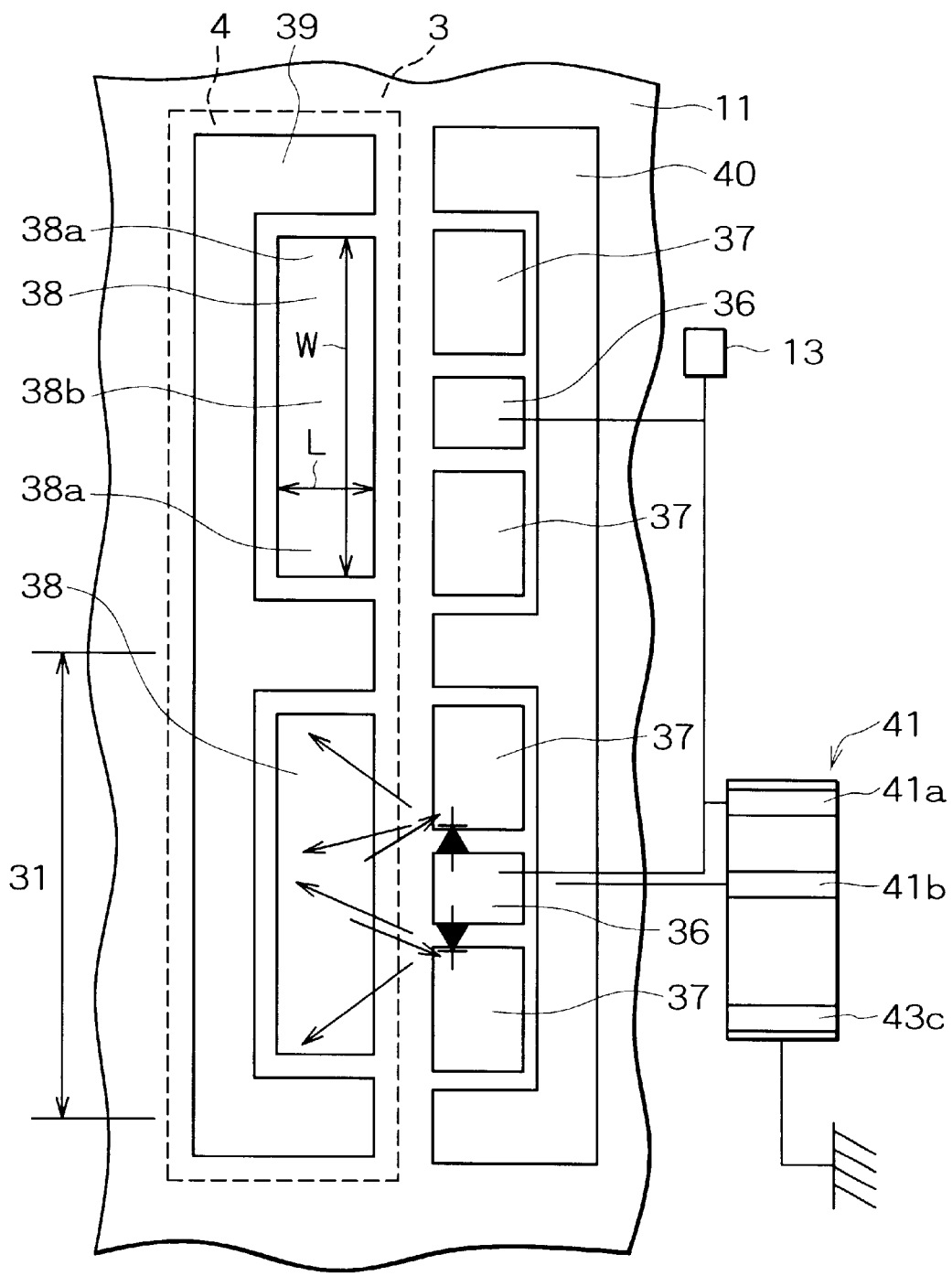
FIG. 13 is a plan view showing an ESD protection device according to a sixth embodiment of the invention.

The sixth embodiment of the invention will be discussed next. FIG. 13 is a plan view showing an ESD protection device according to the embodiment. A holding-current controlled SCR is built in the ESD protection device of the embodiment. As shown in FIG. 13, two unit cells 31 make a pair in the ESD protection device of the embodiment. The N well 4 is formed on the surface of a high-resistance substrate which has an epitaxial silicon layer (not shown) formed on a P$^-$ substrate. As seen from the direction perpendicular to the surface of the high-resistance substrate (hereinafter called "perpendicular direction"), the N well 4 has a rectangular shape. The P well 3 is formed in such a way as to surround the N well 4.

P$^+$ diffusion regions 36 which are trigger taps are formed on the surface of the P well 3. One P$^+$ diffusion region 36 is arranged in each unit cell 31. Two N$^+$ diffusion regions 37 are formed in such a way as to sandwich each P$^+$ diffusion region 36. The N$^+$ diffusion region 37 is the cathode. Further, a P$^+$ diffusion region 40 which is the substrate potential control electrode is formed in an E shape, as seen from the perpendicular direction, on the surface of the P well 3 in such a way as to surround the P$^+$ diffusion regions 36 and the N$^+$ diffusion regions 37. That is, the P$^+$ diffusion region 40 has two recess portions formed in each of which one P$^+$ diffusion region 36 and two N$^+$ diffusion regions 37 sandwiching the P$^+$ diffusion region 36 are located. The P$^+$ diffusion region 40 is connected to the ground electrode via an external resistor element 41 of polysilicon. The trigger circuit 13 is connected to the P$^+$ diffusion regions 36 or the trigger taps and is connected to the ground electrode via the external resistor element 41. The external resistor element 41 is provided with electrodes 41a, 41b and 41c in order and isolated from one another. The electrode 41a is connected to the trigger circuit 13 and the trigger taps (P$^+$ diffusion regions 36), and the electrode 41b is connected to the substrate potential control electrode (P$^+$ diffusion region 40), and the electrode 41c is connected to the ground electrode.

Two P$^+$ diffusion regions 38 which serve as the anode are provided on the surface of the N well 4 in such a way as to face a region which comprises the one P$^+$ diffusion region 36 and the two N$^+$ diffusion regions 37 sandwiching the P+diffusion region 36. Further, an N$^+$ diffusion region 39 having an E shape as seen from the perpendicular direction is formed on the surface of the N well 4 in such a way as to surround the P$^+$ diffusion region 38. The N$^+$ diffusion region 39 is an N well pick-up diffusion. That is, two recess portions are formed in the N$^+$ diffusion region 39 in such a way as to respectively face the recess portions of the P$^+$ diffusion region 40, with one P$^+$ diffusion region 38 located in each recess portion. Those regions of the surfaces of the P well 3 and the N well 4 which are other than the aforementioned diffusion regions are the device isolation region 11. The operation of the ESD protection device according to the embodiment is the same as that of the first embodiment.

As the N well pick-up diffusion (N$^+$ diffusion region 39) is arranged in the vicinity of the anode (P$^+$ diffusion region 38) in such a way as to surround the anode in the ESD protection device of the embodiment, the N well resistance can be made lower. If the width, W, of the anode (P$^+$ diffusion region 38) shown in FIG. 13 is set to about twice the depth, L, for example, the effective N well resistance becomes about a half the N well resistance of the conventional ESD protection device. In an end portion 38a of the anode (P$^+$ diffusion region 38), particularly, the adjacent two sides of the rectangular P$^+$ diffusion region 38 face the N well pick-up diffusion (N$^+$ diffusion region 39), so that the resistance between the end portion 38a and the N well pick-up diffusion (N$^+$ diffusion region 39) gets lower as compared with the resistance between a center portion 38b of the anode (P$^+$ diffusion region 38) and the N well pick-up diffusion. As two sides of the cathode (N$^+$ diffusion region 37) also face the E-shaped P$^+$ diffusion region 40, the resistance (substrate resistance) between the cathode and the P$^+$ diffusion region 40 can be reduced. This can improve the noise immunity of the ESD protection device.

Although the ESD protection device of the embodiment is formed on the high-resistance substrate, the use of the layout to reduce the N well resistance and the substrate resistance has the same problem as the ESD protection device on the P$^+$ substrate (low-resistance substrate) which has been discussed in the DESCRIPTION OF THE RELATED ART, i.e., the problem that the SCR is difficult to operate.

In this embodiment, therefore, the turn-on speed of the SCR is improved as per the first to fifth embodiments. As a positive surge current is applied to the portion due to electrostatic discharge, the current flows in the trigger circuit 13 so that the potential of the P$^+$ diffusion region 36 or the trigger tap rises. This brings about the conduction of the PN diode between the trigger tap (P$^+$ diffusion region 36) and the cathode (N$^+$ diffusion region 37) located on either side of the trigger tap. As a result, part of the electron current that flows in the PN diode is absorbed by the N well pick-up diffusion (N$^+$ diffusion region 39). At this time, however, the center portion 38b of the anode (P$^+$diffusion region 38) which has the highest resistance with respect to the well contact (N$^+$ diffusion region 39) becomes higher than the potential of the end portion 38a and the vertical PNP bipolar transistor which is formed at the center portion 38b by the P$^+$ diffusion region 38, the N well 4 and the P$^+$ substrate is turned on. The PN diode between the anode and the N well can be conducted effectively in this manner, resulting in a lower trigger current so that the SCR can be set on fast.

In the embodiment, the trigger tap (P$^+$ diffusion region 36) and the substrate potential control electrode (P$^+$ diffusion region 40) are connected together via the external resistor element 41. Even in case where the resistance of the P well 3 is high, it is possible to prevent the voltage at which the trigger circuit 13 starts supplying the current from becoming too high. Depending on the resistance between the trigger tap and the substrate potential control electrode, however, the external resistor element 41 may not be essential.

In the embodiment, the holding current can be controlled to the desired value by adjusting the resistance of the external resistor element 41 connected between the P$^+$ diffusion region 40 or the substrate potential control electrode and the ground electrode. The other advantages of the embodiment than the one mentioned above are the same as those of the first embodiment.

Figure 14:
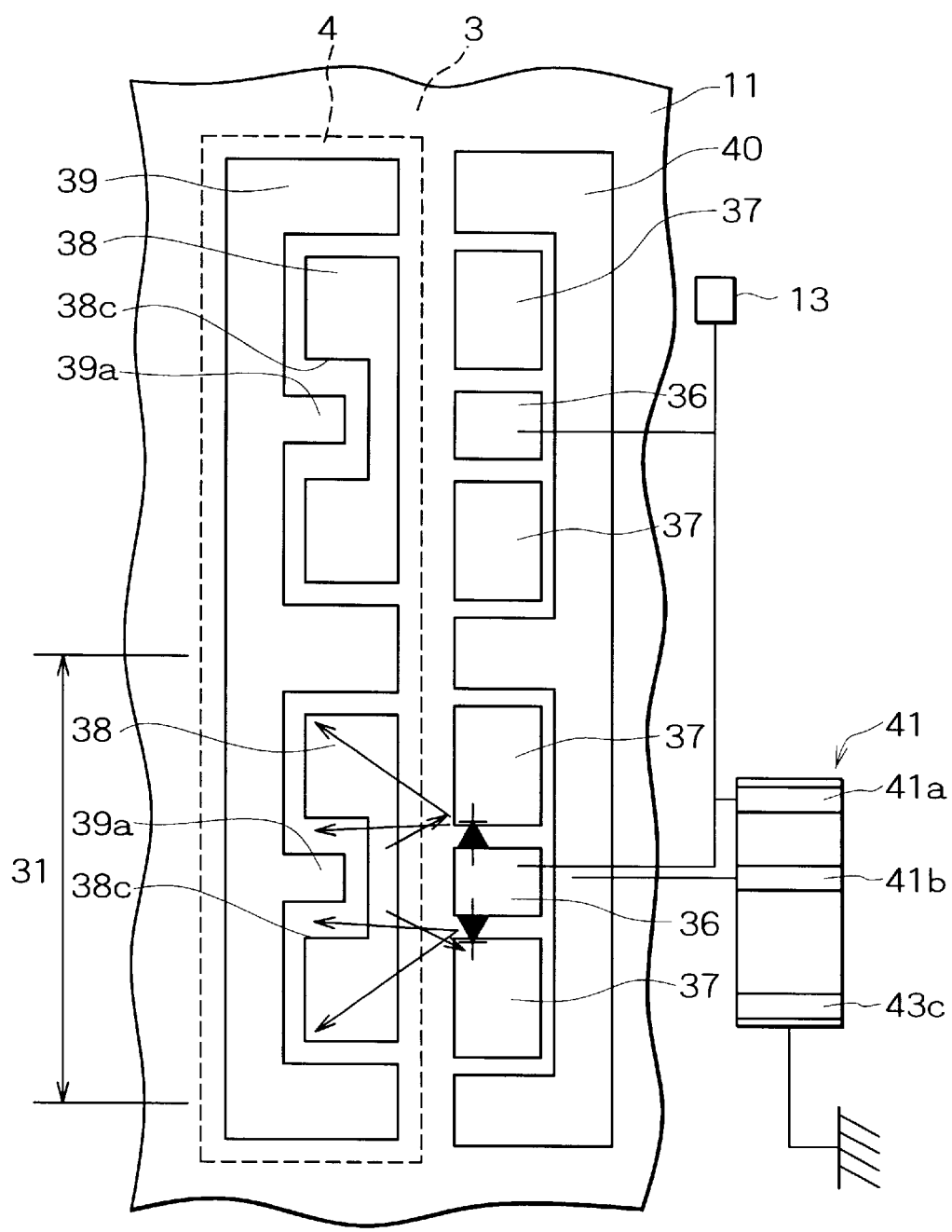
FIG. 14 is a plan view showing an ESD protection device according to a variation of the sixth embodiment.

A variation of the sixth embodiment will be discussed below. FIG. 14 is a plan view showing an ESD protection device according to the variation. The variation differs from the six embodiment in that a recess portion 38c is formed in the edge of the P+ diffusion region 38 or the anode on the opposite side to the cathode (N+ diffusion region 37) and an extending portion 39a is formed on the N+ diffusion region 39 or the N well pick-up diffusion in such a way as to extend into the recess portion 38c. The other structure of the variation than the one discussed above is the same as that of the sixth embodiment. The structure of the variation further reduces the N well resistance to improve the noise immunity.

Figure 15:
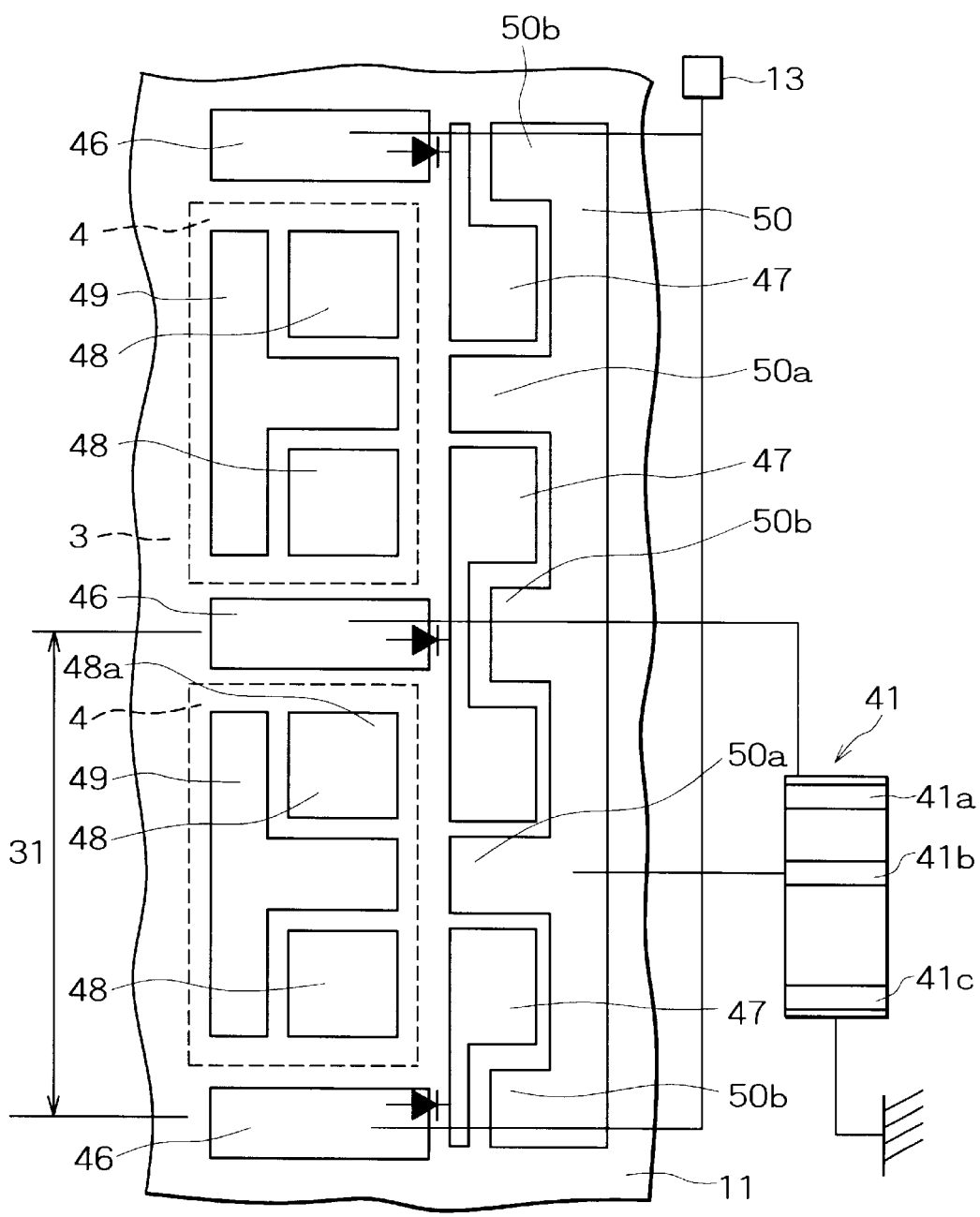
FIG. 15 is a plan view showing an ESD protection device according to a seventh embodiment of the invention.

The seventh embodiment of the invention will be discussed below. FIG. 15 is a plan view showing an ESD protection device according to the embodiment. In the ESD protection device according to the embodiment, as shown in FIG. 15, a single N well 4 is formed in a rectangular shape in each unit cell 31, the P well 3 is formed around the N well 4 and a rectangular P+ diffusion region 46 or a trigger tap is formed between the N wells 4 on the surface of the P well 3. The trigger taps (P+ diffusion regions 46) are connected commonly to the trigger circuit 13 and connected to the external resistor element 41 of polysilicon.

A single T-shaped N+ diffusion region 49 which is an N well pick-up diffusion is formed in the N well 4 and two rectangular P+ diffusion regions 48 are formed in the region in the N well 4 where the N+ diffusion region 49 is not formed and serve as the anode. The P+ diffusion regions 48 are laid out in such a way that two adjoining sides of the rectangular P+ diffusion region 48 face the T-shaped N+ diffusion region 49, another side faces the trigger tap (P+ diffusion region 46) and the other side faces the cathode to be discussed later.

A P+ diffusion region 50 extending in the layout direction of the N well 4 is formed on the surface of the P well 3. The P+ diffusion region 50 is connected to the ground electrode via the external resistor element 41. Extending portions 50a and 50b alternately extend from that side of the P+ diffusion region 50 which faces the N wells 4. The extending portion 50a is longer than the extending portion 50b. The extending portion 50a is laid out in the position to face the axial portion of the T-shaped N+ diffusion region 49. An N+ diffusion region 47 having a square bracket ("]") is formed between the extending portions 50a in such a way as to surround the extending portion 50b and serves as the cathode.

The embodiment can reduce the substrate resistance by taking the above-described layout of the ESD protection device. This can improve the noise immunity of the ESD protection device. While reducing the substrate resistance makes it difficult to turn on the SCR, the potential rises at a corner portion 48a of the anode (P+ diffusion region 48) farthest from the N well pick-up diffusion (N+ diffusion region 49), thus making it easier to trigger the ESD protection device.

Figure 16:
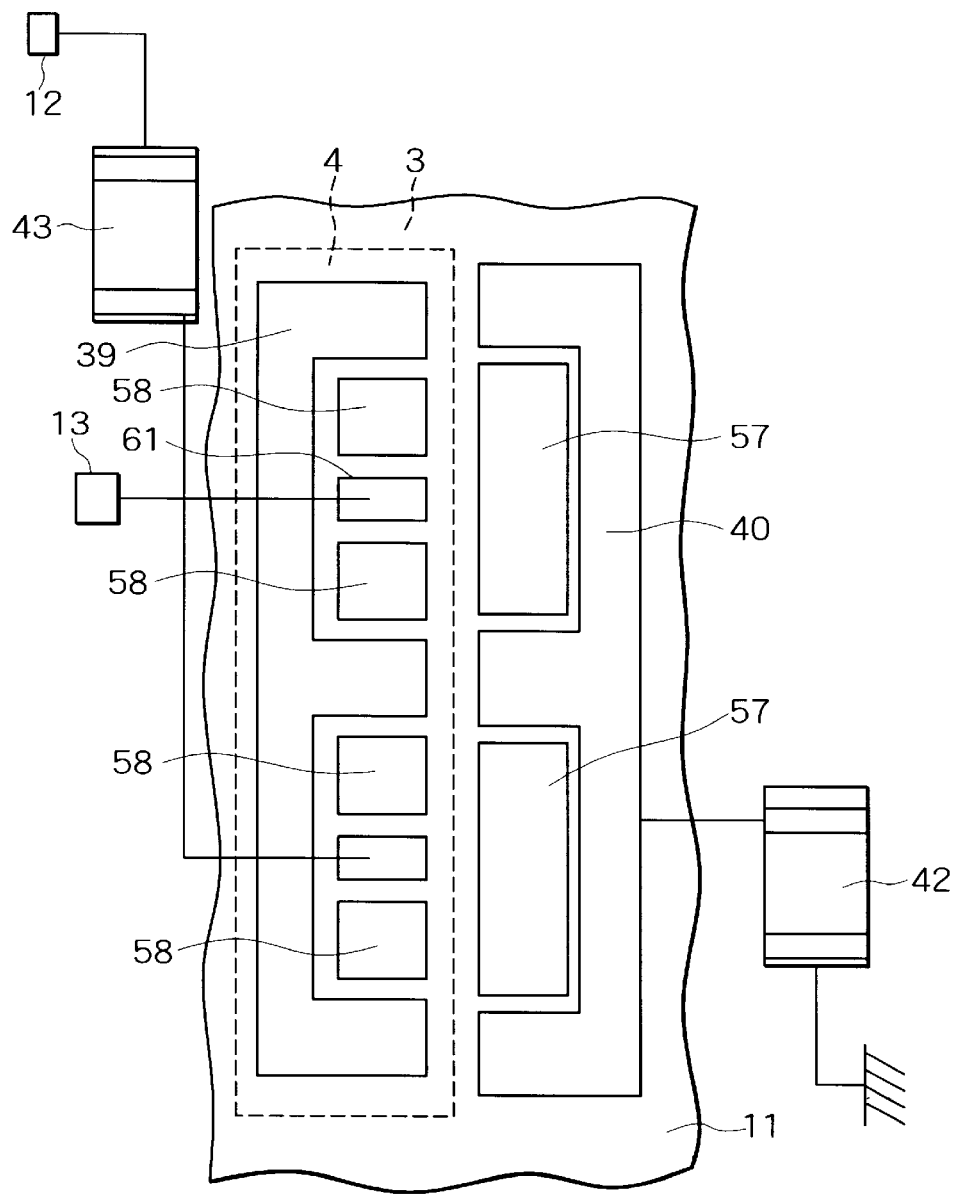
FIG. 16 is a plan view showing an ESD protection device according to an eighth embodiment of the invention.

The eighth embodiment of the invention will be discussed next. FIG. 16 is a plan view showing an ESD protection device according to the embodiment. As shown in FIG. 16, the ESD protection device of the embodiment differs from the sixth embodiment (see FIG. 13) in that two separated P+ diffusion regions 58 are formed as the anode in place of the P+ diffusion regions 38, and an N+ diffusion region 61 which is a trigger tap is formed between the P+ diffusion regions 58. The P+ diffusion region 36 shown in FIG. 13 which is a trigger tap is not formed, but a single cathode (N+ diffusion region 57) is formed in each recess portion of the P+ diffusion region 40. Further, an external resistor element 42 is connected between the substrate potential control electrode (P+ diffusion region 40) and the ground electrode in place of the external resistor element 41 (see FIG. 13) in the sixth embodiment, and an external resistor element 43 is connected between the trigger circuit 13 and the trigger tap (N+ diffusion region 61) and the input pad 12. The other structure of the embodiment than the one discussed above is the same as that of the sixth embodiment.

In the ESD protection device of the embodiment, the trigger tap (N+ diffusion region 61) is placed between the segments of the cathode and two sides of the anode (P+ diffusion region 58) and three sides of the cathode (N+ diffusion region 57) respectively face the electrode regions (N+ diffusion region 39 and the P+ diffusion region 40) which determine the reference potential. Accordingly, the hole current which flows from the PN diode in the N well 4 passes the high-resistance region of the cathode (N+ diffusion region 57) and flows to the P+ diffusion region 40 which is the substrate potential control electrode, causing a potential rise. As a result, the SCR is turned on fast. The other advantages of the embodiment than the one mentioned above are the same as those of the sixth embodiment.

In the sixth to eighth embodiments, as discussed above, the positional relationship between the N well pick-up diffusion and the trigger tap is determined adequately to reduce the N well. As a result, the noise immunity is improved. While this makes it difficult to trigger the SCR, the invention takes such a layout that the electron current passes the high-resistance region of the anode or surely passes under the anode to achieve fast triggering.

Although the foregoing description of each embodiment has been given of the case where the device isolation region is provided between the individual diffusion regions, the device isolation region may be omitted. This design can further reduce the well resistance.

What is claimed is:

1. An electrostatic discharge protection device for protecting an internal circuit against electrostatic discharge applied externally, comprising:

an input pad connected to outside and said internal circuit;

a trigger circuit which is connected to said input pad and in which a current flows when a voltage applied from said input pad exceeds a predetermined value;

a first conductivity type semiconductor substrate;

a second conductivity type well formed in a surface of said first conductivity type semiconductor substrate;

a first first conductivity type diffusion region formed in that region of said surface of said first conductivity type semiconductor substrate which excludes said second conductivity type well and connected to said trigger circuit;

a first second conductivity type diffusion region formed apart from both said second conductivity type well and said first first conductivity type diffusion region in said surface of said first conductivity type semiconductor substrate and connected to a reference potential electrode;

a second first conductivity type diffusion region formed in a surface of said second conductivity type well and connected to said input pad; and second second conductivity type diffusion region formed in said surface of said second conductivity type well and connected to said input pad, a distance between said second first conductivity type diffusion region and said second second conductivity type diffusion region is non-uniform in a first direction orthogonal to a direction extending toward said second second conductivity type diffusion region from said second first conductivity type diffusion region.

2. The electrostatic discharge protection device according to claim 1, wherein said second second conductivity type diffusion region is formed in such a position as to sandwich said second first conductivity type diffusion region together with said second first conductivity type diffusion region, and a length of said second second conductivity type diffusion region in said first direction is shorter than a length of said second first conductivity type diffusion region in said first direction.

3. The electrostatic discharge protection device according to claim 1, wherein at least two second second conductivity type diffusion regions are formed.

4. The electrostatic discharge protection device according to claim 1, wherein one of said first second conductivity type diffusion region and said second second conductivity type diffusion region has a rectangular shape and at least two sides of that one diffusion region face the other diffusion region.

5. The electrostatic discharge protection device according to claim 1, wherein said second first conductivity type diffusion region has:
a main portion located between said first second conductivity type diffusion region and said second second conductivity type diffusion region; and
an extending portion extending from said main portion in a direction toward said second second conductivity type diffusion region.

6. The electrostatic discharge protection device according to claim 1, wherein said second first conductivity type diffusion region has a comb-like shape having a proximal end portion extending in said first direction and a plurality of distal end portions extending from said proximal end portion in a second direction orthogonal to said first direction, and said second second conductivity type diffusion region is located between said distal end portions.

7. The electrostatic discharge protection device according to claim 1, wherein said second second conductivity type diffusion region has a comb-like shape having a proximal end portion extending in said first direction and a plurality of distal end portions extending from said proximal end portion in a second direction orthogonal to said first direction, and said second first conductivity type diffusion region is located between said distal end portions.

8. The electrostatic discharge protection device according to claim 1, wherein at least two first second conductivity type diffusion regions are formed and at least a portion of said first first conductivity type diffusion region is located between two of said at least two first second conductivity type diffusion regions.

9. The electrostatic discharge protection device according to claim 1, wherein said first second conductivity type diffusion region is formed in such a way as to surround said first first conductivity type diffusion region, said second conductivity type well is formed in such a way as to surround said first second conductivity type diffusion region, and said second first conductivity type diffusion region is formed in such a position as to sandwich said first second conductivity type diffusion region together with said first first conductivity type diffusion region.

10. The electrostatic discharge protection device according to claim 1, wherein a first conductivity type well is formed in that region of said surface of said first conductivity type semiconductor substrate which excludes said second conductivity type well and said first first conductivity type diffusion region and said first second conductivity type diffusion region are formed in a surface of said first conductivity type well.

11. The electrostatic discharge protection device according to claim 1, further comprising a third first conductivity type diffusion region formed in that region of said surface of said first conductivity type semiconductor substrate which excludes said second conductivity type well and applied with a constant potential.

12. The electrostatic discharge protection device according to claim 11, wherein said third first conductivity type diffusion region is laid out in such a way as to face at least two sides of said second second conductivity type diffusion region.

13. The electrostatic discharge protection device according to claim 11, wherein said constant potential is applied to said third first conductivity type diffusion region via an external resistor device.

14. The electrostatic discharge protection device according to claim 1, wherein said first first conductivity type diffusion region, said first second conductivity type diffusion region, said second first conductivity type diffusion region and said second second conductivity type diffusion region are laid out in a named order.

15. The electrostatic discharge protection device according to claim 1, wherein said first conductivity type is a P type and said second conductivity type is an N type.

16. The electrostatic discharge protection device according to claim 1, wherein said reference potential electrode is a ground electrode.

* * * * *